United States Patent [19]

Harra et al.

[11] Patent Number: 5,417,833
[45] Date of Patent: May 23, 1995

[54] SPUTTERING APPARATUS HAVING A ROTATING MAGNET ARRAY AND FIXED ELECTROMAGNETS

[75] Inventors: David J. Harra, San Francisco; Larry D. Hartsough, Berkley, both of Calif.

[73] Assignee: Varian Associates, Inc., Palo Alto, Calif.

[21] Appl. No.: 47,599

[22] Filed: Apr. 14, 1993

[51] Int. Cl.[6] ............................................. C23C 14/35
[52] U.S. Cl. .............................. 204/298.2; 204/298.16
[58] Field of Search ..................... 204/298.12, 298.16, 204/298.17, 298.19, 298.2, 298.21, 298.22

[56] References Cited

U.S. PATENT DOCUMENTS

| | | | |
|---|---|---|---|
| 4,444,643 | 4/1984 | Garret | 204/298 |
| 4,606,806 | 8/1986 | Helmer | 204/298 |
| 4,891,560 | 1/1990 | Okumura et al. | 204/298.19 |
| 4,995,958 | 2/1991 | Anderson et al. | 204/298 |
| 5,188,717 | 2/1993 | Broadbent et al. | 204/298.2 |
| 5,262,030 | 11/1993 | Potter | 204/298.2 |

FOREIGN PATENT DOCUMENTS

| | | | |
|---|---|---|---|
| 439361 | 7/1991 | European Pat. Off. | 204/298.2 |
| 4017112 | 12/1991 | Germany | C23C 14/35 |
| 59-173265 | 1/1984 | Japan | C23C 15/00 |
| 62-211375 | 9/1987 | Japan . | |

*Primary Examiner*—R. Bruce Breneman
*Assistant Examiner*—Rodney McDonald
*Attorney, Agent, or Firm*—Gerald M. Fisher

[57] ABSTRACT

A magnetron sputter apparatus is disclosed which includes a rotatable generally heart-shaped, closed-loop magnet array behind the target and in front of a pair of separately driven stationary electromagnets. The apparatus is optimized to produce a sputtered film on a planar substrate having desired film characteristics such as uniformity of thickness, good step coverage, and good via filling and efficient utilization of the target. The shape of the generally heart-shaped array includes a flattened tip forming an arc of a circle centered on the axis of rotation and concave cusps in the lobes of the heart-shape. The electromagnets are used to increase target utilization at its center and to compensate for the change in shape of the target and distance from the target to the substrate with depletion.

16 Claims, 6 Drawing Sheets

SPUTTERING APPARATUS HAVING A ROTATING MAGNET ARRAY AND FIXED ELECTROMAGNETS

FIELD OF THE INVENTION

This invention pertains to a method and apparatus for making fine adjustment in the magnetic field of a magnetron sputtering apparatus, and in particular to fine adjustments to the field produced by a rotatable magnet array and more particularly to fine adjustments in the localized sputtering intensity of the plasma supported therein.

RELATED APPLICATIONS

U.S. patent application Ser. No. 471,898, filed Jan. 26, 1990, invented by John Helmer and Robert Anderson and owned by the assignee of the instant application, now abandoned is incorporated herein by reference.

BACKGROUND OF THE INVENTION

Physical vapor deposition by sputtering is a well known process that has widespread application in the fabrication of integrated circuit semiconductor devices. In semiconductor device fabrication, a large number of integrated circuit devices are normally formed on a thin, generally circular semiconductor substrate known as a wafer. Integrated circuit device fabrication involves a large number of processing steps, with sputtering typically being used to provide metal layers which serve as interconnects between devices and device layers. Most commonly, sputtered aluminum is the material used for these purposes. Modern semiconductor processing has also seen the increased use of sputtered tungsten, tungsten silicide, titanium, titanium nitride and other films.

Sputter coating is carried out in a vacuum chamber filled with an inert gas in which a target of sputterable material is subjected to an electric potential with respect to the chamber anode. Electrons which are excited in the vicinity of the target strike and ionize the gas ions and the positive ions strike the target causing target atoms to be ejected.

A magnetron sputtering source is capable of high rate sputtering and represents an enormous improvement over devices forming thin films based on diode sputtering or evaporative techniques. In magnetron sputtering a plasma is formed in a low pressure inert gas by the application of a suitable DC or RF electric field. The plasma is confined by a magnetic field to a region near a target which is made of the material to be sputtered and which usually serves as the cathode of the system. The magnetic field, typically having field lines which loop through the sputter target surface, restricts the trajectories of the electrons of the plasma to retard their transport to the anode and confine them in a region so that ions in the plasma bombard the sputter target dislodging atoms of the target material which then become deposited on a substrate, i.e. a semiconductor wafer.

The demand for lower cost circuits implies larger wafer sizes which imposes greater demands on sputtering systems. For example, one requirement of a sputtering system used in semiconductor processing is that it deposit a layer of uniform thickness over the entire wafer surface. (Hereinafter, the term uniformity will be used in connection with the thickness of the deposited film unless the context suggests otherwise.) Lack of uniformity might result in lowered device yield (i.e., the percentage of the devices which meet operating specifications) and/or variations in device performance. Larger wafer sizes make it more difficult for sputter systems to achieve very demanding levels of uniformity and step coverage. Likewise, the trend towards ever smaller integrated circuit device geometries has required that even greater levels of sputtered film uniformity be achieved.

Other sputtered film characteristics are also quite important to integrated circuit device manufacturers. For example, as noted above, sputtered conductive material is frequently used to form interconnects between devices and between the metal layers. Forming interconnects involves uniformly filling small diameter holes, called vias, in the surface of a wafer. As integrated circuit device geometries have shrunk, the difficulty in filling vias with sputtered material has increased appreciably. Step coverage, or the ability of the sputtered film to evenly conform to angular features on the wafer is, likewise, another important film characteristic.

An earlier approach to improving the uniformity and step coverage characteristics of a sputtered system is to sputter from two concentric targets. For an example of this approach see U.S. Pat. No. 4,606,806 which describes a sputtering source sold by the assignee of the subject invention. In this system, each of the sputter targets has a unique shape and its own separate power supply enabling separate control over the sputtering rate from each target. As wafer size increased this system was replaced, primarily due to undesired particles forming on the substrate believed to be caused by areas of net build-up of sputtered material.

A number of commercially available sputtering sources use planar sputtering targets. Early designs of the planar magnetron sputtering device used a stationary magnet which had practical shortcomings, the most serious of which is that the plasma discharge is localized and erodes a narrow groove in the target in the vicinity of the greatest magnetic field strength. This localized erosion generates a non-uniform distribution of sputtered atoms from the target and a film with non-uniform thickness on the semiconductor wafer. The non-uniform erosion of the sputter target leads to inefficient target utilization. Given the high cost of the sputter targets used in semiconductor manufacture, it is important to obtain the greatest possible target utilization that is consistent with the need for sputtered film uniformity and other required sputtered film characteristics.

Numerous attempts, some partially successful, have been made to modify the planar magnetron source to extend the target erosion and to make the distribution of sputtered atoms more uniform. Attempts have been made to spread out the erosion over a larger surface by using extended magnetic fields. The magnets required for such an approach are large and complicated, and it is difficult to assure that the properties of the magnetron plasma do not change as the target erodes. The resulting erosion pattern is thus difficult to predict.

U.S. Pat. No. 4,444,643, which is incorporated herein by reference, describes a sputtering device which includes a mechanically rotated annular permanent magnet assembly. The rotation of the permanent magnet assembly causes erosion over a wide area of the target. A version of the sputtering source according to the '643 patent have been sold commercially by the assignee of the present invention. This source relies on a rotating permanent magnet mounted behind the target for moving the plasma over the face of the target. Rotation of the plasma improved the uniformity and step coverage, as well as improving the uniformity of target erosion so that targets are more efficiently utilized.

The rotating sputtering source, while a significant improvement over planar magnetron sources employing stationary magnets, nonetheless did not produce truly uniform sputtered film nor uniform target utilization. Thus, efforts have been made to develop improved rotating magnet designs for use with planar targets. (The term "planar target" is intended throughout this specification to be descriptive of the sputter target surface before it is eroded. Those skilled in the art will recognize that after the target has been eroded it might no longer have a planar surface.)

One direction that has been taken by those seeking to improve the design of rotating magnets used with planar magnetron sputtering sources has been the use of closed-loop, generally heart-shaped magnet configurations. Such magnet configurations typically employ an array of magnets which are centered along a line defining a heart-shaped, closed loop. The heart-shaped rotating magnet array can produce more uniform target erosion. While uniform erosion is important, the characteristics of the sputtered film, such as uniformity, are of greater importance to integrated circuit device manufacturers. In many instances, as will be described below, a non-uniform target erosion pattern improves the uniformity of the sputtered film.

Another sputtering source having a heart-shaped magnet arrangement is described in Japanese Patent Application Publication (Kokai) No. 62-211,375. That application prescribes the use of a heart-shaped closed-loop magnet having a curve defined by the equation $$R = L - A + 2A|\theta|/\pi \quad (for -\pi \leq \theta \leq \pi)$$

where the center of the sputter target is located at the origin of a polar coordinate system, R is the distance between the origin and a point on the curve defining the magnet centerline, L is the distance between the center of the heart and the cusp of the heart, and A is the distance between the center of the heart and the center of the target. No derivation is given as to how the inventors arrived at this equation. As discussed in the '375 Japanese application, a magnet having the prescribed curve will not produce uniform erosion nor uniform deposition. Moreover, the '375 application does not teach how to obtain any arbitrarily selected erosion profile.

U.S. Pat. No. 4,995,958, also assigned to the assignee of the subject invention, describes another generally heart-shaped, closed-loop magnet array for use in a planar magnetron sputtering source. The '958 patent, which is hereby incorporated by reference, includes a rigorous mathematical analysis to show how to construct a closed-loop rotating magnet to realize a predetermined erosion profile to thereby achieve, for example, highly efficient target material utilization and high deposition rates.

Among other things, the '958 patent describes the shortcomings of the prior art and shows how the prior art fails to provide a teaching which truly enables one to obtain uniform erosion of a planar sputter target. Importantly, FIGS. 12A–12E of the '958 patent, and the related text, clearly show that minor changes in the shape of the heart-shaped magnet might lead to very dramatic differences in the resulting erosion pattern of the sputter target. Given the demonstrated fact that minor perturbations of the shape of the heart-shaped magnet might cause significant changes in the resulting target erosion profile, it becomes quite difficult to optimize the shape empirically. Thus, the mathematical analysis of the '958 patent is a highly significant teaching in making heart-shaped, closed-loop magnets practically useful.

A closed-loop magnet configuration of the type described in the '958 patent has the additional advantage of being adjustable, i.e., the shape of the magnet array, and therefore the characteristics of the sputtering source, can be changed without great difficulty or expense. As prescribed in that patent, a plurality of magnets are held in position by two iron keepers, or pole pieces, which define the shape of the closed-loop. Replacement and/or adjustment of the iron keepers to provide a different closed-loop configuration is a relatively simple matter. In this manner, it is possible to use one source for different purposes, or to adjust the source as needs change.

A prime objective of the closed-loop rotating magnet of the '958 patent was to achieve better target utilization efficiency, normally an important objective given the high cost of sputter targets, and to achieve high deposition rates, another factor due to the demand for ever greater sputtered film "throughput". As noted above, the need for greater sputtered film uniformity generally outweighs the need for efficient target utilization and deposition rate. Accordingly, the '958 patent provides the basis for obtaining any arbitrary target erosion profile. It is noted, however, that the '958 patent provides no instruction as to how to determine what erosion profile to use under a given set of conditions to maximize sputtered film uniformity or other sputtered film characteristics.

As prescribed therein, the mathematical analysis provided in the '958 patent is inapplicable at discontinuities at two areas of the heart, i.e., in the area near the "tip" of the heart and in the area near the "cusp" of the heart. As a result of the inapplicability of the teaching of the '958 patent to the region of the cusp of the heart, the designs they show do not utilize optimally the very center of the target or the target edge. Moreover, the analysis of the '958 patent is based on the assumption that the magnet has uniform strength at all points along the loop. If true, the total quantity of material sputtered per unit length of the magnet would be a constant. It has been observed that this assumption is not correct.

It is noted that all of the heart-shaped designs shown in the '958 patent, and other prior art are symmetrical about a line which passes through the tip, the cusp, and the axis of rotation of the heart. The symmetry of the '958 designs is due to the fact that their method of generating a heart-shaped magnet is by forming a shape over 180° (i.e. over one half of the polar coordinate system) and then mirroring this shape to close the loop over the remaining 180°. However, as used herein, the term heart-shaped does not require that there be two strictly symmetrical halves. As will be described below, there might be circumstances when an asymmetrical heart-shaped magnet is desired. Likewise, as used herein, the term heart-shaped, does not require that the heart have a noticeable "tip". It has been found that there are advantages to using a design wherein the region farthest from the axis of rotation and generally opposite the cusp forms an arc of a circle. As used herein, the term "heart" implies that there is a cusp-like transition between two lobes. The cusp-like transition might be smoothed for design convenience.

Finally, it has been discovered that there are discrepancies between the position" of the plasma adjacent to the sputter target surface as predicted in the '958 patent and as empirically measured for the location of the magnet per the '958 patent. As noted above, even minor changes in the shape of the magnetic field generated by a heart-shaped magnet might result in significant variations in the erosion profile obtained.

As taught in U.S. Pat. No. 4,995,958, the centerline of a heart-shaped, closed-loop magnet array lies on a curve defined by the equation $$\theta = \int_1^r \frac{\sqrt{\xi^2(u)u^2 - 1}}{u} du + C$$

where $\xi(u)$ is a function defining a preselected erosion profile and C is a selected constant. As described in the '958 patent, each of the magnets is uniformly disposed on a centerline, which lies between spaced apart inner and outer keepers. The spacing between the inner keeper and the outer keeper is uniform at all points except in the vicinity of the tip and the cusp of the heart. Iron keepers are about 1/16" thick. The magnet array is mounted on a plate which is connected to means for rotating it about an axis of rotation.

An erosion profile can be calculated for the magnet array in the teachings of the '958 patent. In other words, the centerline of the magnet array is laid out, per the above equation to produce a theoretical erosion profile. Stated equivalently, the function $\xi(u)$ is a constant so as to produce uniform erosion between the limits of integration. It is noted, however, that for $r \leq 1$ the equation is equal to a constant.

Various other heart-shaped, closed-loop magnet shapes designed to theoretically produce different sputter target erosion profiles wherein the function $\xi(u)$ is not a constant are shown in FIGS. 12A–12E of the aforementioned '958 patent. It will be noted from an inspection of these figures, and the accompanying text, that minor variations in the shape of the heart-shaped magnet will produce significant differences in the shape of the resulting erosion profile. It follows that, while use of a properly configured heart-shaped, closed-loop magnet in connection with a planar magnetron sputtering device can result in improved target erosion uniformity, it is not obvious how to empirically arrive at the proper shape necessary to produce any arbitrary erosion profile.

Each of the heart-shaped magnet arrays shown in the '958 patent, or in any other prior art of which the inventors are aware, is symmetrical about a line which runs through the tip, the cusp and the axis of rotation of the magnet. Moreover, each of the prior-art magnets is "pointed" at its tip. In other words the centerline is not smooth at the point the curve is reflected, i.e., the derivative of the centerline is discontinuous at this point.

EPC Patent Application Serial No. 91-300565.8 (hereinafter the '565 application) also assigned to the assignee of the subject invention, describes magnet configurations based on the teaching of the '958 patent but extended to correct for the limitations of the of the '958 patent so that uniform erosion could be obtained in the center region of the target. Such an improved heart-shaped, closed-loop magnet array for use in a planar magnetron sputtering system, has been sold commercially by the assignee of the subject invention. This magnet array is based on the teachings of the '958 patent as extended by the '565 application. In contrast to the heart-shaped designs of the '958 patent, this includes magnets positioned in the vicinity of the axis of rotation of the magnet array. In this commercial embodiment, the placement of the magnets near the axis of rotation is not strictly restricted to the teachings of the '565 application but also incorporates a combination of designer intuition and empirical results. It is noted that near the lobes and cusp of the heart, the iron keepers are not uniformly spaced, and the departure from uniform spacing of the keepers in the vicinity of the cusp is far greater than the slight departure present in the previous designs. However, the lack of uniform spacing makes the placement of the magnets more difficult in this vicinity. Moreover, as described in the '565 application, the magnets in the central region could be different in strength.

While this magnet design represents an improvement over the design of the prior art insofar as it produces better target utilization near the center of the sputter target, the mathematical analysis that is required is difficult. In addition, it has been determined that neither the earlier nor the improved design precisely results in the erosion profile predicted by the teachings of the '958 patent or of the '565 application.

An improved design for a heart-shaped, closed-loop magnet array for use in a planar magnetron sputtering system has been disclosed in a patent application by D. Harra entitled "Sputtering Apparatus With a Magnet Array Having a Geometry With A Specified Target Erosion Profile", U.S. Ser. No. 07/855,988, filed Mar. 20, 1992, the disclosures of which are hereby incorporated by reference.

Before describing the method used to arrive at the shape of the permanent magnet array, a description of its shape vis-a-vis the prior art is given. Starting at the cusp of the heart, it is noted that the inner keeper crosses the axis of rotation of the magnet array while maintaining nearly even spacing between inner keeper and outer keeper in the vicinity of the cusp. Thus, this portion of the magnet achieves a better performance without the complexities of other embodiments shown in the '565 application.

It will also be noted that, just beyond the lobes of the heart, the shapes of the magnet array has two inward inflections. In other words, while the shape of the prior art heart-shaped magnets are all such that the curve is at all times convex in relation to the interior of the loop, in this improvement, there are two portions of the curve that are concave in relation to the interior of the loop.

Finally, it should be noted that this improvement has no pointed tip. While this improvement is symmetrical about a line running through the cusp and the axis of rotation of the heart, the portion of the curve that lies farthest away from the axis of rotation, and which lies on either side of the axis of symmetry, lies on an arc which is preferably the arc of a circle. Accordingly, the curve at this point is smooth, i.e., the derivative of the curve is continuous at this point. Moreover, a major portion of the heart, perhaps as much as one fourth or more of the curve, lies on this arc.

The method by which the shape of the improved magnet array, and by which other shapes can be constructed to produce a selected erosion profile will now be described. An initial heart-shaped, closed-loop magnet array is first constructed. In the rotatable magnet array included in the preferred embodiment of the subject invention, the initial closed-loop magnet might be constructed either in accordance with the principles described in the '958 patent or the manner used to create the improved magnet, so that a desired erosion profile will be approximated by the initial magnet shape. It is also possible to start with other heart-shaped designs, including those known in the prior art.

This initial magnet array is then placed in a sputtering system and the system is operated while holding the magnet array stationary to generate a static erosion groove in the surface of the sputter target. When performing this step it is preferred that the sputter target be constructed of material which will be used with the magnet array being designed, and that the operating parameters of the system coincide with the actual operating parameters that will be used by the system in production. For reasons that are not fully understood, it has been observed that the static erosion profile produced by a given magnet array will differ slightly depending on the material that is being sputtered.

As is to be expected, the resulting static erosion groove is also heart-shaped and forms a closed loop. Moreover, as expected from the prior art of planar magnetron sputtering using a stationary magnet array, any given cross section of the erosion groove around the loop has a valley like appearance having a bottom region where erosion is greatest. However, for reasons that are not fully understood, the bottom of the erosion groove does not overly the center of the magnet array. This discrepancy between the bottom of the erosion groove and the centerline of the magnet array, if not corrected or compensated for, will produce results that vary from the teachings of the '958 patent.

An important premise of the '958 patent is that the region of greatest target erosion directly overlies the centerline of the magnet array. This premise is based upon the assumption that the magnetic field intensity adjacent to the target surface is greatest directly over the magnetic centerline. It has now been empirically observed that this premise is not fully accurate. As noted above, minor changes in the configuration of the heart-shaped, closed-loop magnet array can result in significant changes in the erosion profile produced by the magnet array. The discrepancy between the shape of the magnet array and the erosion profile it produces during static sputtering can be thought of as meaning that the magnet array being used has a different effective shape than is intended. This problem is not recognized in the '958 patent, nor does the '958 patent teach how to compensate for the discrepancy to produce a magnet with proper effective shape.

After a static erosion groove is made, the shape of the groove is carefully measured at a finite number of points around the groove and a plot is generated showing the mathematical relationship between position and depth of target erosion. These measurements are made in polar coordinates. For example, at a finite number of values of R, (R being the radial distance from the axis of rotation of the magnet array), the depth of target erosion is measured as a function of the angle $\theta$.

For $R=K_i$, where $K_i$ is a given value of distance from the center of rotation, it is seen that a typical erosion profile includes two regions of erosion as one rotates from 0° to 360°. A set of similar plots are then created for a finite number of values of $K_i$, for example twenty such plots might be created, e.g., if the radius of the target is 5 inches, then the plots could be created at each quarter inch interval between the origin and the edge of the target. The values $K_i$ can be thought of as defining a set of concentric circles centered around the axis of rotation. The present technique does not require that the values of $K_i$ be evenly spaced. For example, one might select values of $K_i$ that correspond to the positions of the individual magnets in the array.

Each of the static erosion plots that have been empirically created using this technique is then integrated over a revolution of the magnet to produce a value of erosion depth E(R) for that particular value of $K_i$. The erosion depth values for each $K_i$ are then plotted to generate an overall erosion profile for the magnet when it is rotated. The integration required by this step can be performed using standard numerical integration techniques that are well-known to those skilled in the art.

It has been found that the calculated erosion profile conforms to the observed erosions profile generated when the magnet is rotated.

The static erosion data plotted to form the graph can be plotted in another manner. Rather than plot the erosion depth at a certain radial distance as a function of angle the erosion depth data can be plotted at a finite number of angles $\theta = \alpha_i$, as a function of distance, r. If the target is thought of being a wheel, the data points can be thought of as the erosion profile taken along a "spoke" of the target, where each spoke is again an angle $\alpha_i$.

It will be apparent to those skilled in the art that the static erosion profile data can be represented equivalently in a three dimensional system or numerical array wherein a finite number of data points on the surface of the sputter target each has a set of values associated with the angular position $\theta$, the erosion depth $E(R,\theta)$, and the radial distance R of that point on the surface of the sputter target from the origin, i.e., the axis of rotation.

The curves thus calculated have been conveniently used to adjust the shape of the magnet array to correct for the discrepancy between the predicted erosion profile of the '958 patent and the static erosion profile observed. How this is done will now be explained. This discrepancy between the effective shape of the magnet and the actual shape is readily apparent from the offset between center line and the point of greatest erosion. For convenience, the position of the centerline of the magnet along the x-axis is arbitrarily defined to be at the point $x=0$. A fifth order polynomial is then derived, using known mathematical techniques, to fit the data points.

It is assumed that a minor perturbation of the centerline of the magnet at a given $\alpha_i$ will not affect the shape or offset of the curve at any other value of $\alpha$. These assumptions are quite reasonable if the displacement of each magnet at each $\alpha$ is small. In order that these assumptions remain valid, it is best to start with an initial magnet shape which is expected to be close to what the final shape will be, so that the perturbations of the positions of the individual magnets remain small. However, if the perturbations grow too large, the technique described herein can be done on an iterative basis.

The effect of making minor adjustments to the position of the magnet centerline at selected values of $\alpha_i$ can be readily translated into a revised, calculated erosion profile that reflects the adjustments that have been made. Thus, it is possible to calculate the perturbations in the position of the magnets at selected points that are needed to produce a preselected erosion profile on the surface of the target.

So long as the perturbations of the magnet positions are small enough that the assumptions described above remain reasonable, the technique that has been described is a very powerful tool for selecting a magnet shape that will produce a selected erosion profile. While based in principle on the techniques of the '958 patent, it will be seen that this technique has several advantages over what is shown in the '958 patent. These advantages include the ability of the present technique to obtain a magnet shape that will result in preselected erosion profile, accounting for the discrepancy between the actual and the effective shape of the magnet array. It is also advantageous to have the ability to predict and adjust the shape of the erosion profile in the vicinity of the cusp of the magnet, and in the vicinity of the magnet closest to the edge of the sputter target. It is also important to have the ability to correct for variations in the erosion intensity over the length of the closed-loop. Finally, it is also an advantage to have the ability to make perturbations in the shape of the magnet to produce an asymmetrical heart-shaped design.

The use of an asymmetrical design allows greater "fine-tuning" of the magnet shape. In a symmetrical design, any magnet centerline adjustment in a region lying on one half of the magnet is doubled because the same adjustment is automatically made to the symmetrical half. Using the present technique, it is possible to adjust one half of the magnet in a predictable way while holding the other half unchanged. This is because the technique uses data taken over the full 360° of the coordinate system.

As noted, by making suitable adjustments to the centerline of the magnet, it is possible to produce a magnet that has an effective shape that is in accordance with the teachings of the '958 patent. In other words, it is possible to configure a magnet that produces a static erosion pattern on the surface of the target a portion of which conforms to the equation $$\theta = \int_1^r \frac{\sqrt{\xi^2(u)u^2 - 1}}{u} du + C$$

where $\xi(u)$ defines a preselected erosion profile and where the centerline of the magnet is displaced from the centerline of the static erosion groove to compensate for the discrepancy therebetween.

Having shown how to obtain a magnet having a shape that results in a predetermined erosion profile on the surface of the sputter target, we now turn to a discussion of how to determine what is the optimal erosion profile. While many of the prior art patents emphasize the desirability and importance of uniformly eroding the surface of the sputter target, uniformity of erosion is actually a secondary consideration to most users of sputtering systems. The primary consideration is the need to consistently obtain a sputtered film having desired characteristics, for example, uniformity on the wafers being coated. This is a technique that can be used to calculate the target erosions profile that will result in a film having the desired characteristics of the surface of the wafer.

This technique for predicting the uniformity of film deposition takes into account a number of variables that affect the rate at which sputtered material accumulates at any given point on the surface of the substrate. The important variables that enter into this will now be discussed.

First, it is necessary to know the angular distribution of atoms ejected from the surface of the sputter target. It is frequently assumed, for the sake of simplicity, that sputtered atoms are ejected in a cosine distribution. This assumption is reasonable in the case of aluminum, the most commonly used sputtered film in semiconductor integrated circuit fabrication, where the atomic weight of the material ($z=27$) is significantly less than the atomic weight of argon ($z=40$) which is typically used as the sputtering gas,. It is known, however, that when sputtering higher atomic weight materials such as titanium ($z=48$) or tungsten ($z=184$), the angular distribution of the sputtered atoms does not conform to a cosine distribution. Moreover, in some cases the crystalline structure of the sputter target material could also affect the angular distribution of sputtered atoms.

The initial step in determining a desired erosion profile is to establish the angular distribution of the atoms being sputtered under the operating conditions that will be used by the system. If the requisite information is not available from the literature, this might be accomplished by empirical measurement using the material to be sputtered in a system operated under similar conditions. After the distribution is empirically determined, the data is then fit to a mathematical function which approximates, to at least the first order, the measured distribution. In the preferred method, it has been found useful to approximate the empirical data by using a distribution function which is a power of the cosine function multiplied by a second function having an adjustable parameter, as set forth in the equation $$\left| \frac{(1 + K_1)\left(\frac{2\theta}{\pi}\right)}{K_2} \right| (\cos\theta)^n$$

where $K_1$ is an adjustable parameter selected to fit the data and $K_2$ is a scaling factor.

The next parameter which needs to be understood before a calculation of a desired erosion profile can be made is the distance between the substrate and the sputter target. Normally, the distance between the sputter target surface and the wafer will be constant (ignoring the effect of target erosion), in a given system configuration. In most applications, it is desirable to space the substrate as close as possible to the sputter target to maximize the deposition rate and to minimize the loss of target material. (From the foregoing discussion of the angular distribution of sputtered atoms, it should be apparent from the geometry that an atom which leaves the surface of the target at an acute angle has a greater chance of landing on the substrate if the substrate is closely spaced to the target. (If a significant number of atoms do not land on the substrate, both the rate of film deposition will be lowered and the waste of material will be increased.)

On the other hand, close coupling of the target and the substrate makes it more difficult to obtain adequate sputtered film uniformity. It is sometimes preferable to interpose shields, shutters, collimators, etc., to enhance the sputtered film characteristics or to control the sputtering process, and the present magnet designs and methods are applicable where the source to substrate spacing is increased to accommodate such structures.

As a practical matter, sputter sources having a wafer-to-target distance of 2 to 10 cm are now in use.

Another geometrical parameter that must be considered in the calculation of the desired erosion profile is the relative sizes of the sputter target and the wafer. If uniformly eroded, a target that is larger than the substrate will result in considerable waste of sputtered material. On the other hand, if the target is similar in size or smaller than the wafer, it will be more difficult to achieve adequate deposited film uniformity. Such a configuration would also make it difficult to achieve adequate "step-coverage" in the deposited film, where step coverage is a well-known measure of the ability of the film to coat angular features on the device depending on which way those features were facing. There would be a low flux of sputtered material arriving at the wafer at angles toward the perimeter and, thus, it is likely that outwardly facing features near the edge of the wafer would not receive an adequate coating of sputtered film. On the other hand, inwardly facing features at the same location would likely receive an adequate coating of sputtered film since the flux of material would be from angles corresponding to the center of the target.

Most modern integrated circuit devices are now being made on eight-inch diameter wafers, and prior-art sputter targets have diameter as large as 11.64 inches, i.e., the edge of the target extends almost two inches beyond the edge of the wafer.

Yet another parameter that should be considered in calculating the optimum sputter target erosion profile is the operating pressure of the sputter system. While the sputtered atoms might leave the surface with a certain angular distribution, collisions between gas molecules (or plasma ions) and sputtered atoms might alter the trajectories of the sputtered atoms before they reach the wafer surface. The scattering effect of gas collisions on the angular distribution of sputtered atoms reaching the surface of the wafer can be calculated. It has been found, in the context of the operating parameters used here that gas collisions might or might not be a significant factor depending upon the total pressure used during sputtering. The effects of gas scattering can be reduced with close coupling between the target and the substrate and low operating pressure of the sputtering system, i.e., 1 millitor.

Thus, using this method for determining the desired target erosion profile involves first determining the geometry of the system. In particular, knowledge of the target-to-substrate spacing and the diameters of the target and the substrate are required. Next, one defines a mathematical function which approximates, at least to the first order, the distribution of sputtered atoms leaving the surface of the sputter target at the operating conditions of the sputter source. Finally, if necessary, an adjustment is made to the distribution function to account for gas scattering effects.

With the foregoing information in hand, it is then possible to calculate a target erosion profile that will result in the application of a uniformly thick sputtered film on the surface of the wafer. The calculation is based on the fact that the erosion rate at a point on the surface of the target is a measure of the sputtering rate from that point. Such a calculation can be performed using a variety of computer modeling techniques of the type that are well known in the art. It should be noted that there will be more than one erosion profile that will produce uniform sputtered film deposition. It is desirable to select an erosion profile which both produces a uniform film and, to the greatest extent possible, makes the best use of the target material, and low particulation by avoiding target areas of net build up.

Having arrived at a desired erosion profile in the foregoing manner, it is then possible to configure the magnet, in the manner described above, to obtain the desired erosion profile.

This technique has, thus far, been described as two separate procedures, i.e., a procedure for calculating a desired erosion profile and a procedure for configuring a heart-shaped, closed-loop magnet to obtain the desired erosion profile. These two procedures can be combined into a single method in which all the necessary information is entered into a computer model. The effect on sputtered film uniformity due to minor perturbations in the position of the magnet centerline at one or more locations can then be directly calculated. One could use such a combined model to prescribe a suitable magnet configuration for a given set of parameters.

The flow of the process whereby the sputtered film uniformity is directly calculated with changes in the magnet position is as follows. As described above, the first step is to form a static erosion groove on the surface of the sputter target. The depth of target erosion is then measured at a finite number of points as a function of radius, r, and angle, $\theta$ on the surface of the target. For selected values of $\theta$, fifth order polynomials are constructed to fit the observed data, and the polynomials are entered into an array. For simplicity, the fifth order polynomial for a particular $\theta$ is made relative to the centerline of the magnet used to generate the static erosion groove.

The coordinates of the centerline of a new magnet shape to be tested are then entered into an array and the distance from each value of radius, r, and angle, $\theta$ used in the array to the new magnet centerline is calculated and entered into an array. Preferably, the position of the centerline of the new magnet does not vary significantly at any given location from the position of the centerline of the magnet used to form the static erosion groove. A static erosion depth calculation is them made for each value of radius, r, and angle, $\theta$ based on the new magnet positions. The calculated static erosion depth information is then integrated over a revolution of the magnet to obtain a calculated erosion profile associated with the new magnet positions.

The uniformity of the sputtered film is then calculated, using the target erosion profile calculated above. As described above, the calculation of film uniformity should take into account the geometry of the sputtering system as well as the characteristics of the material being sputtered and any significant gas scattering effects. The calculation involves a double integration so that the effects of the release of material at a given rate and at a given distribution from each point on the target is assessed for each point on the wafer. The double integration involves calculating, for each point on the surface of the wafer, the amount of material that will be deposited. This, in turn, involves integrating the flux from each point on the target both as a function of angular position and as a function of radial position. After the uniformity information is thus calculated, a judgement is made as whether acceptable uniformity has been achieved, i.e., the calculated uniformity for each of the points of the wafer is compared to determine the variance in film thickness across the wafer surface. If acceptable film uniformity has been achieved, i.e. if the variance has been minimized, the method is complete and the magnet shape is constructed. If the film uniformity is not acceptable, or if it is thought that further improvement might be achieved, the magnet shape is further perturbed and the process is repeated again from that point.

A systematic approach to perturbing the magnet is as follows. Starting with the magnet shape that is used to form the static erosion groove, a new magnet is defined wherein the position of the magnet is changed at only one point, which might be at any selected value of $\theta$. After the sputtered film uniformity for this new magnet is calculated, the uniformity obtained is compared with the uniformity obtained by the prior magnet configuration. If the uniformity is improved, the same magnet position is further adjusted in the same direction and another uniformity calculation is made. If the uniformity is degraded, the magnet is moved in the opposite direction and a new uniformity calculation is made. The first magnet position is iteratively adjusted until no further improvement in uniformity is obtained. Thereafter, the next magnet position is adjusted and the same procedure is followed until no further adjustment of the second magnet produces improved uniformity. This process is repeated for all of the magnet positions in sequence, after which the entire process can be repeated as many times starting again at the first magnet position. This systematic approach lends itself quite well to automation, and can be implemented easily by a computer program. Other, equivalent systematic approaches will be apparent to those skilled in the art. For example, one might limit the adjustments of any given magnet position to a set number during each "loop" around the magnet.

Up until now, this method has been described solely in the context to measuring a static erosion groove to determine the "effective" magnet shape. While this is the preferred manner of implementing the method, other methods are possible. For example, it is possible to measure the "effective" magnet position by observing the position and intensity of the plasma created by a starting magnet. Modern techniques allow one to accurately measure the plasma intensity at a finite number of preselected points over the target, and this information could be used as a substitute for the information obtained from a measurement of a static erosion groove. It is believed, however, that the plasma intensity information would not be as accurate and is, therefore, less preferred.

While the flow of the process has been described solely in the context of sputtered film uniformity, other sputtered film characteristics can also be taken into account. For example, a calculation of the step coverage produced by the new magnet configuration or of the via-filling properties could be used. While the present techniques for via-filling involve steps which go beyond simple sputtering, the ability to deposit a suitably thick layer of film at the bottom of the via is an important aspect of the process. It should be apparent from geometrical considerations that the ability to fill the bottom of a narrow via is related to the angular distribution of the atoms of sputtered material striking the surface of the wafer. Thus, sputtered atoms which are incident at the wafer surface in a substantially perpendicular direction are likely to reach the bottom of a via, whereas atoms which are incident at a sharp angle will be intercepted by a wall of the via before reaching the bottom.

Likewise, more than one film characteristic can be calculated, with the goal of optimizing the balance between them. For example, improved uniformity caused by a particular magnet perturbation might be offset by degraded step coverage.

U.S. patent application No. 471,898, which is a continuation-in-part of the '958 patent, and which is also hereby incorporated by reference, extends the teachings of the '958 patent so that magnet arrays can be constructed for use with non-planar sputter target surfaces to produce arbitrarily selected erosion profiles. A condition required by the '898 application is that the sputter target surface be a surface of revolution. The '898 application teaches that the centerline of the closed loop magnet array should lie on a curve defined by $$\theta = \int_1^R \sqrt{\left[1 + \left(\frac{dz}{dr}\right)^2\right][r^2\xi^2(r) + 1]} \ \frac{dr}{r} + C$$

where $\xi(r)$ is a preselected erosion profile to be generated in the curved target when the magnet is rotated and sputtering is performed, $z(r)$ is a surface of revolution defining the surface of the sputter target, and $C$ is a selected constant.

Like the '958 patent, a premise of the '898 application is that the magnetic field intensity adjacent to the target surface is greatest directly above the centerline of the magnet array so that the shape of a static erosion groove would conform to the shape of the magnet. Again, it will be apparent to those skilled in the art that the methodology of the present invention can be applied to magnets configured in accordance with the '898 application to compensate for discrepancies between the actual and the effective magnet array shapes.

This description of the prior art pertinent to the subject invention clearly indicates the complexity of the art and the difficulty of following the strict dictates of a mathematical analysis. The interaction of a plasma with magnetic and electric field is not a trivial problem even in an idealized environment. In the real environment of complex geometries and non-uniform materials, mathematical analysis and the intuition of those experienced in the art has not been adequate to find solutions to the problems. Indeed, one of the inventors of the '958 patent, was requested by the applicants of this invention to model magnetic fields of the invention claimed here and he indicated that the small changes in magnetic field predicted might not be useful. In fact, tests have proven our invention to be effective. It is clear that the magnetic field models are inadequate for predicating the associated plasma responses and use of empirical methods is still necessary in this complex technology.

OBJECTS OF THE INVENTION

It is therefore a primary objective of the present invention to obtain better sputtered film characteristics especially uniformity and better utilization of the target in a magnetron sputter source especially when using a generally heart-shaped, closed-loop rotating magnet array in a planar magnetron sputtering device.

Another object of the present invention is to provide the apparatus and methods for enabling the user to adjust the shape of the magnetic field used in a planar magnetron sputtering system so as to produce a desired uniformity profile on a substrate.

Still another object is to increase the efficiency of utilization of the material at the center and at the edge of the target.

Yet another object of the subject invention is to provide a method and apparatus for compensating for the change of distance between target and substrate as a function of time.

SUMMARY OF THE INVENTION

The objects of the invention and other objects, features and advantages shall become apparent as the specification progresses and are accomplished by a magnetron sputter apparatus having a rotatable array of magnets by providing at least one stationary electromagnet mounted behind the rotatable magnet array.

LIST ADVANTAGES OF THE INVENTION

The most important advantage is that the uniformity of deposition can be significantly improved by using a stationary electromagnet along with a rotating heart-shaped permanent magnet array.

The ability to vary the magnetic field with time also permits compensation for the change of the target to substrate distance as time progresses, thereby maintaining uniformity of deposition in spite of a significant change in geometry.

An important advantage of the present invention is that the electromagnet used in combination with an optimized heart-shaped array can be used to increase or decrease target utilization at the center of the target.

A further advantage of the present invention is the ability to vary over time the resultant magnetic field with the electromagnet, thereby permitting some compensation for the change in shape of the target as it depletes.

These and further objectives, constructional and operational characteristics, and advantages of the invention will no doubt be more evident to those skilled in the art from the detailed description given hereinafter with reference to the figures of the accompanying drawings which illustrate a preferred embodiment by way of non-limiting example.

Lexicon

"Generally heart-shaped" is defined herein to mean a closed loop having a generally convex shape relative to a center of the figure not necessarily symmetric about an axis and having one generally concave portion separating two lobes, the concave portion having radii of curvature smaller than that of the loop in general.

"Tip of the heart" is defined herein to mean the generally convex portion of the loop furthest away from the axis of rotation.

"Cusp of the heart" is herein defined to mean the generally concave portion nearest the axis of rotation and which lies between the two lobe-shaped portions of the heart.

Glossary

Figure 1:
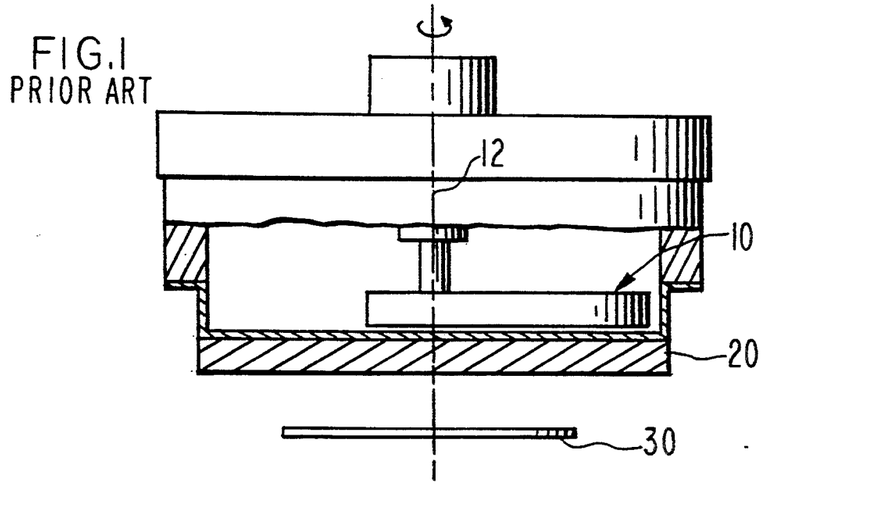
FIG. 1 is a schematic simplified perspective view of a portion of a prior art magnetron source having a rotatable magnet.

The following is a glossary of elements and structural members as referenced and employed in the present invention:

10—rotatable magnet array in the prior art as shown in FIG. 1
12—axis of rotation of the rotatable magnet array 10
20—target of material to be sputtered
21—target front sputter face
22—target rear face
30—substrate such as a semiconductor wafer on which the film of sputtered target material is to be deposited
35—flat electromagnet coil according to the invention
36—iron channel
40—outer coil according to the invention
45—inner coil according to the invention
50—heart-shaped, closed-loop magnet array of magnets according to the invention
55—inner keeper of the array 50
60—outer keeper of the array 60
65—support plate for the array 50
70—cusp of the heart-shaped array 50 according to the invention
76,77—inward inflections in the lobes of the heart-shaped array according to the invention
80—axis of approximate symmetry of the array 50
85—portion of the array 50 which is formed as an arc of a circle

DESCRIPTION OF THE PREFERRED EMBODIMENTS

Referring now to the drawings wherein like reference numerals are used to designate like or corresponding parts throughout the various figures thereof, there is shown in FIG. 1 a schematic simplified perspective view of a portion of a prior art planar magnetron source having a rotating magnet. The source and wafer are mounted in a vacuum chamber not shown. A magnet array 10 is mounted eccentrically on a shaft so that it rotatable about a center line 12. The magnet array 10 is mounted behind a target 20 of the material to be sputtered, such as aluminum. A semiconductor wafer 30 is mounted to face the target 20. A plasma gas, for example a plasma of argon gas, fills the space between the target 20 and the semiconductor wafer 30 at low pressure. The target 20 and wafer 30 are insulated from each other and maintained at different electrical potentials.

Figure 2A:
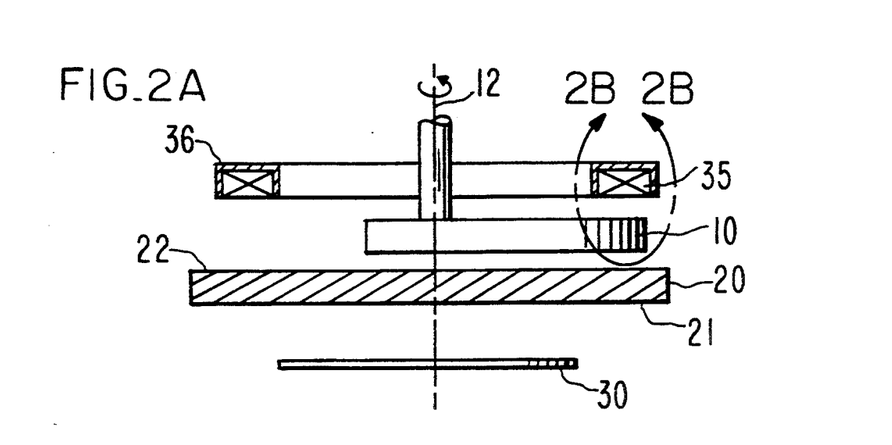
FIG. 2A shows a schematic of one embodiment of the sputter source according to the invention.
Figure 2B:
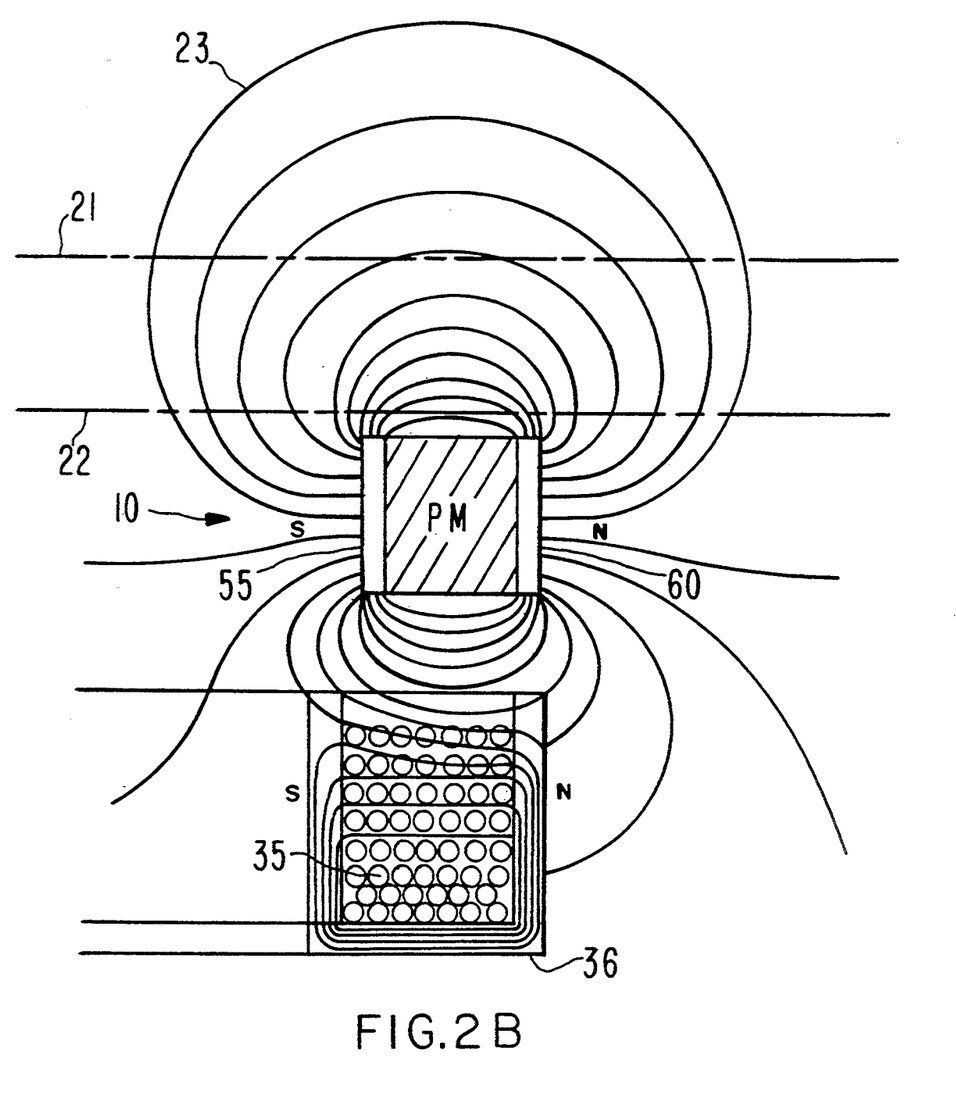
FIG. 2B shows an illustration of a blow-up of section B—B from FIG. 2A.

FIG. 2A shows a schematic diagram of one embodiment of the sputter apparatus according to the invention. The magnet array 10 is again mounted eccentrically to a shaft so that it is rotatable behind the target 20. A flat electromagnet coil 35 in an iron channel 36 is mounted in a fixed position behind the rotatable magnet array 10. The coil 35 is of similar diameter comparable to the target. The coil 35 is powered from a current sources (not shown) capable of supplying current in either direction and generating a magnetic field parallel which is constrained by the iron yoke 36 to exit from the channel substantially entirely in the direction of the rotating magnet array 10 as seen in FIG. 2B. This particularly preferred embodiment can be used to improve the utilization of the target at the center, increase the deposition rate and uniformity and compensate for the erosion of the target with time.

Figure 3:
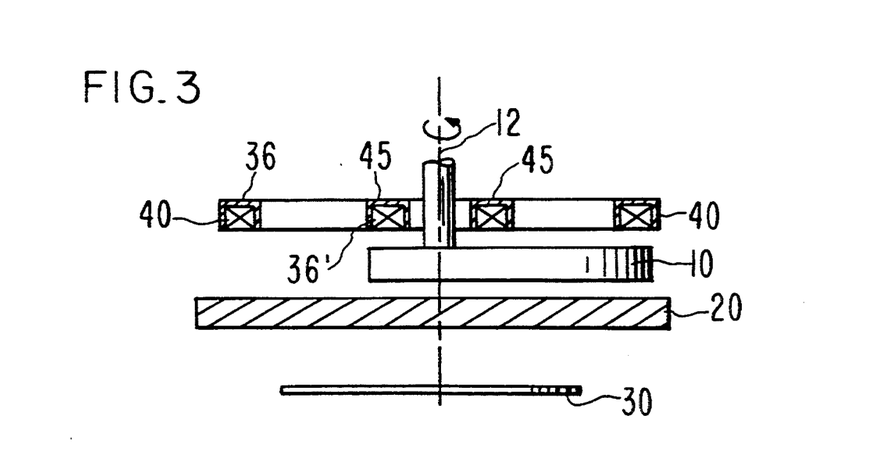
FIG. 3 shows a schematic of a second embodiment according to the invention.

Another preferred embodiment uses two flat coils, an outer 40 and inner coil 45, as shown in FIG. 3. These are powered independently from external current sources (not shown)capable of supplying current in either direction. It is of particular advantage in improving the uniformity of the sputtered film to direct the magnetic fields from the inner and outer coils in opposite directions, as will be discussed hereinafter. Each coil is positioned in an iron channel with the open face toward the rotatable magnet.

With reference to FIG. 2B, the structure of the electromagnet coil 35 inside an iron channel 36 is schematically illustrated. The iron channel acts as a low reluctance path to the magnetic flux which are constrained to be substantially entirely retained by the iron channel except at the channel open face. The channel provides a shielding effect so that the effect of the electromagnet is restricted to the region adjacent its open face. In addition, the iron results in a stronger and higher magnetic intensity on the open face side of the coil than would have occurred without the channel for the same number of ampere-turns. As can be seen, the electromagnet 35 will modify the magnetic field which interfaces and loops 23 through the target sputter face 21. The loop 23 is seen to be distorted which will affect the plasma which is retained by the looping field to be in contact with the sputter target surface 21. The permanent magnets are arranged inside the channels 55 and 60. Typically, the rotating magnet array 10 is positioned as close as feasible to the target rear face, i.e. 0.030 inches is usual.

The dimensions, placement and winding of the coils are not critical since the magnetic field can be changed by changing the current. For a target 30 of 11.64 inches the inner coil 45 and outer coil 40 could have mean diameters of about 4 and 9 inches, respectively. The inner coil 45 and larger coil 40 could be mounted on a common fixed support plate (not shown). The inner and outer coils could be formed, for example, of about 170 turns of #14 wire.

Figure 4:
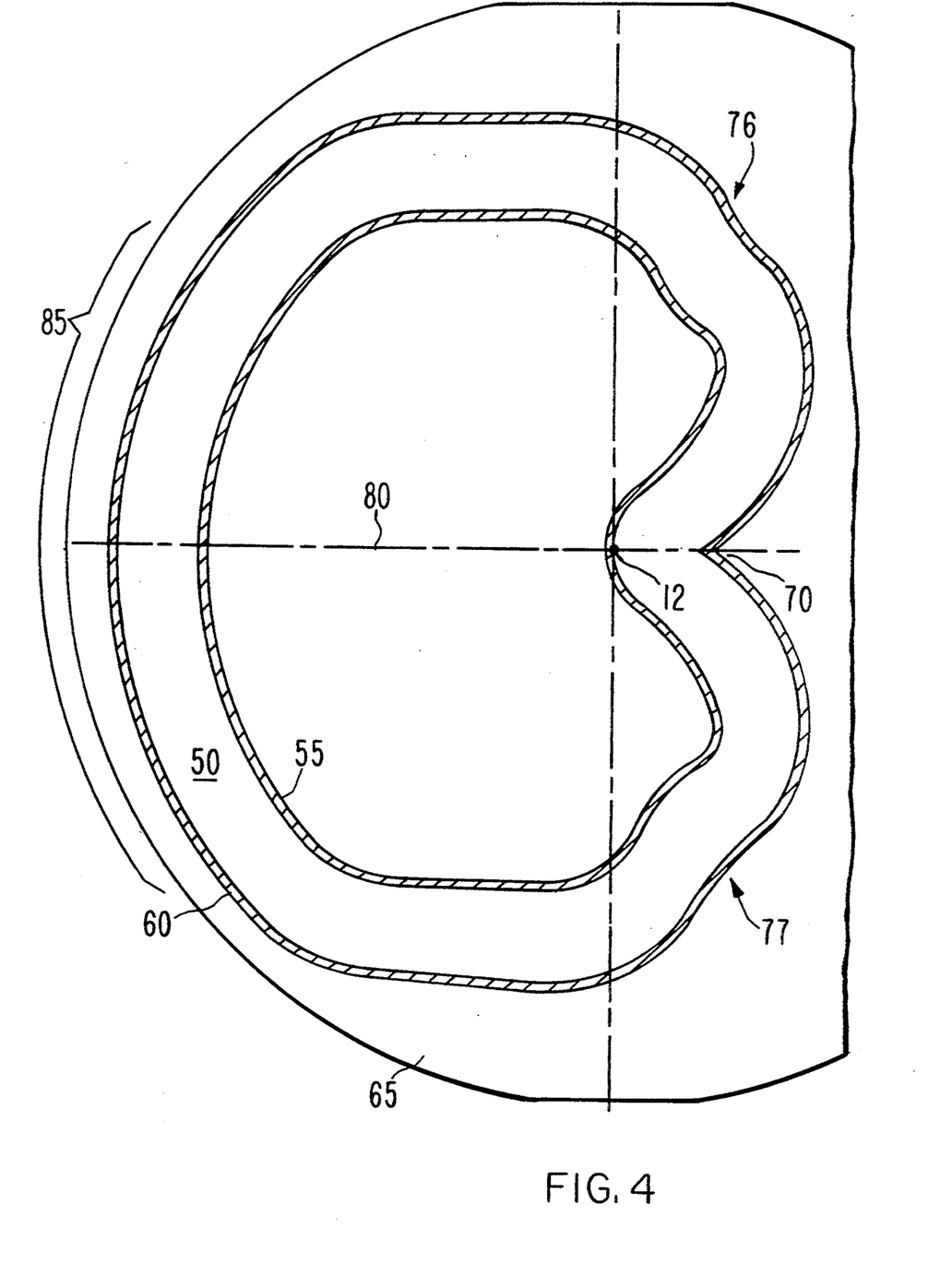
FIG. 4 is a schematic plan view of a heart-shaped, closed-loop, magnet array for use in a planar magnetron sputtering system built according to the present invention.

In a preferred embodiment the rotatable magnet is an array 50 of individual magnets between keepers in the improved heart-shaped, closed-loop rotatable array disclosed by Harra shown in FIG. 4. In the interest of clarity, the individual magnets which comprise the array are not shown. Rather, only the inner iron keeper 55 and outer iron keepers 60 are shown in relation to the axis of rotation 12 and the plate 65 that magnet array is mounted on. Starting at the cusp 70 of the heart, it is noted that the inner keeper 55 crosses the axis of rotation 12 of the magnet array while maintaining nearly even spacing between inner keeper 55 and outer keeper 60 in the vicinity of the cusp 70. It will also be noted that, just beyond the lobes of the heart, the shapes of the magnet array has two inward inflections 76 and 77. In other words, while the shape of the prior art heart-shaped magnets are all such that the curve is at all times convex in relation to the interior of the loop, in the embodiment of FIG. 4, there are two portions of the curve, 76 and 77, that are concave in relation to the interior of the loop.

Finally, it should be noted that the FIG.4 embodiment has no pointed tip. While the FIG.4 embodiment is symmetrical about line 80 running through cusp 70 and the axis of rotation 12 of the heart, the portion of the curve that lies farthest away from the axis of rotation 12, and which lies on either side of the axis of symmetry 80, lies on an arc of a circle. Accordingly, the curve at this point is smooth, i.e., the derivative of the curve is continuous at this point. Moreover, in the FIG. 4 embodiment, a major portion of the heart 85, perhaps as much as one fourth or more of the curve, lies on this arc. Although this rotatable array is symmetric, it is not a requirement for this invention.

While the preferred embodiment is described in connection with a magnet array of the type depicted in the prior art having iron keepers which serve as pole pieces, it will be recognized by those skilled in the art that other magnet arrangements are possible. For example, segmented magnets of the type shown and described in the aforementioned '964 patent will be recognized as being equivalent. A segmented magnet array offers the advantage of being easier to adjust from one configuration to another and, if desired, to fine tune.

Figure 5:
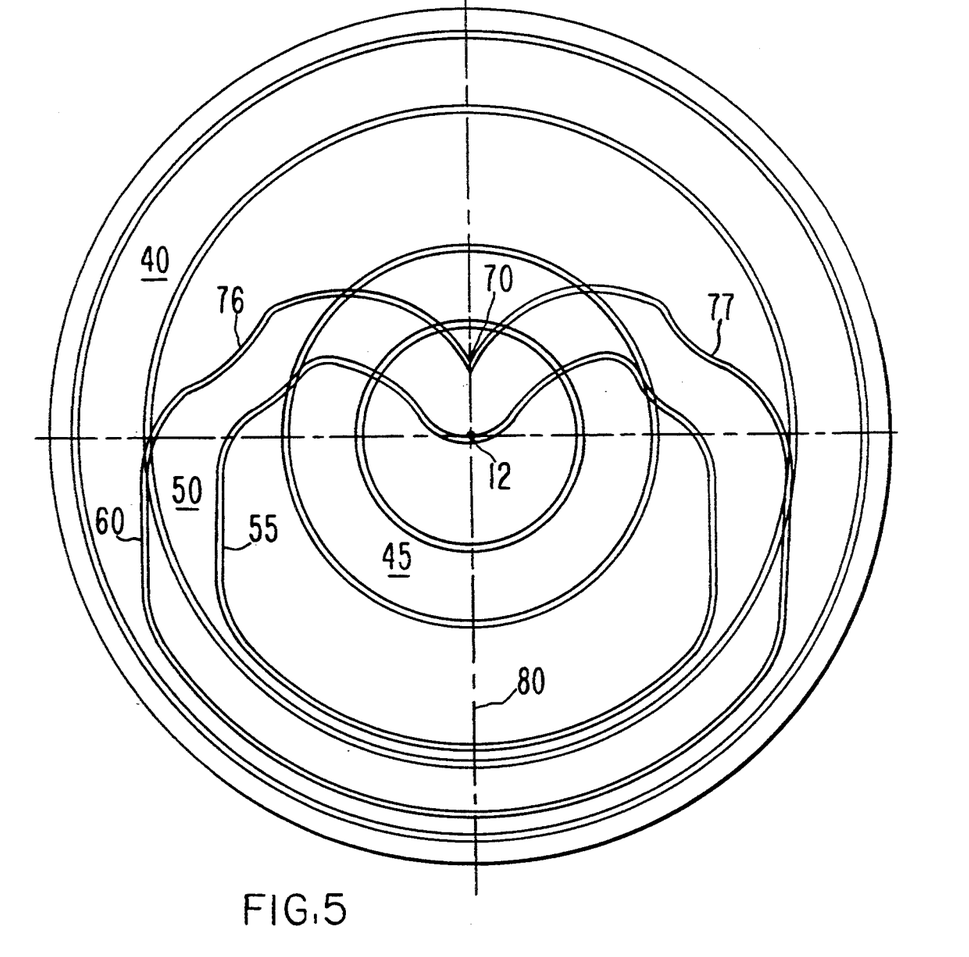
FIG. 5 shows a schematic plan view of a particularly preferred embodiment combining an improved generally heart-shaped, closed-loop rotatable magnet with an inner flat electromagnet coil and an outer electromagnet flat.
Figure 6:
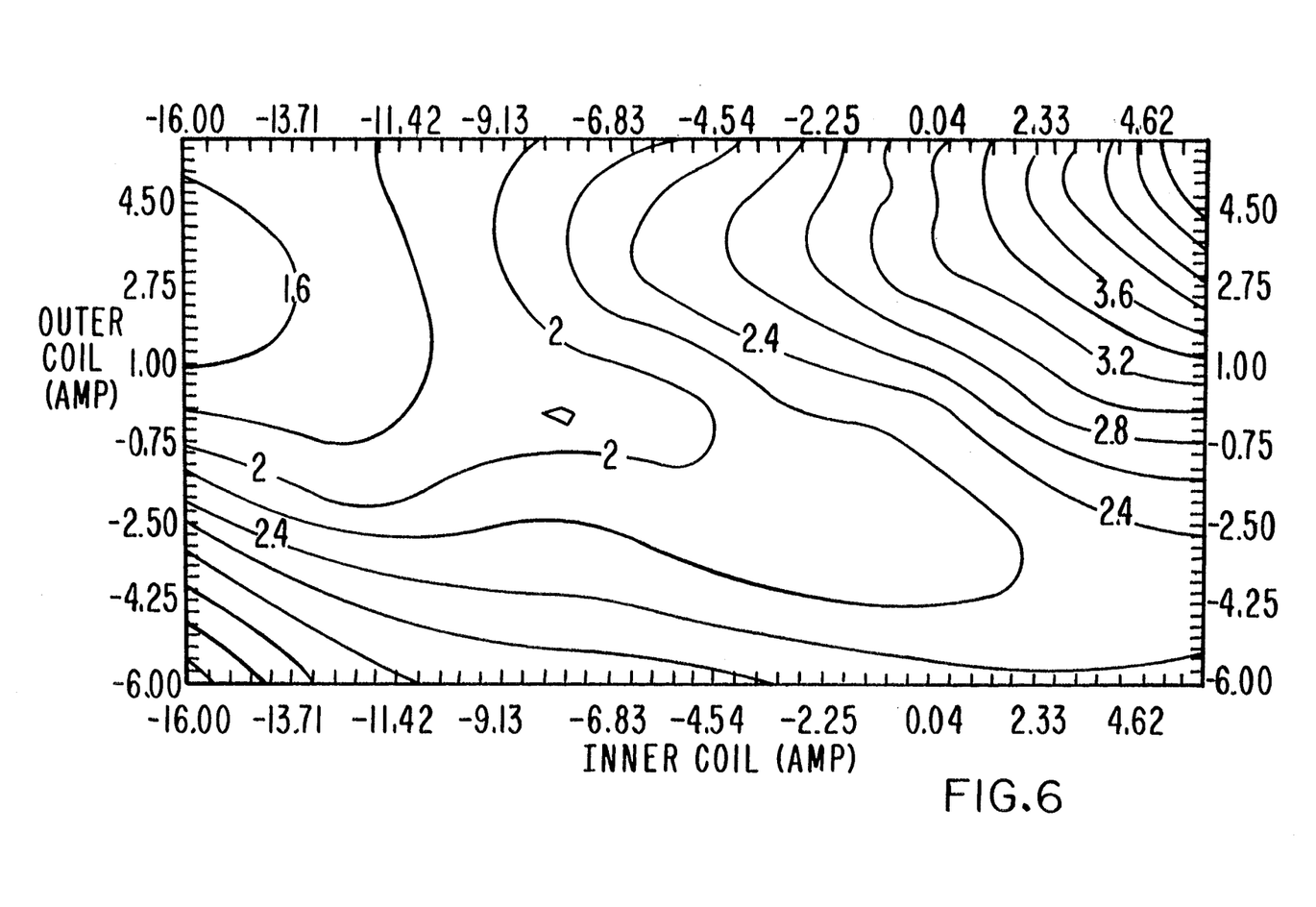
FIG. 6 is a contour map of sheet resistance uniformity for a titanium thin film as a function of inner and outer coil currents in the particularly preferred embodiment of FIG. 5.

FIG. 5 shows a schematic plan view of a particularly preferred embodiment combining an improved generally heart-shaped, closed-loop rotatable magnet 50 with an inner fiat electromagnet coil 45 and an outer fiat electromagnet coil 40. The outer coil is approximately the same size as the target while the inner coil is from one half to one quarter that size. FIG. 6 is a contour map of sheet resistance uniformity for a titanium thin film as a function of inner and outer coil currents in the particularly preferred embodiment of FIG. 5. The graph shows the effect of making the current both positive and negative in either coil independently. The region of best uniformity is found at the upper left in this figure where the current in the outer coil is a positive 3 amps and the current in the inner coil is a negative 16 amps, i.e. the magnetic fields from the inner and outer coils are opposing each other.

Figure 7:
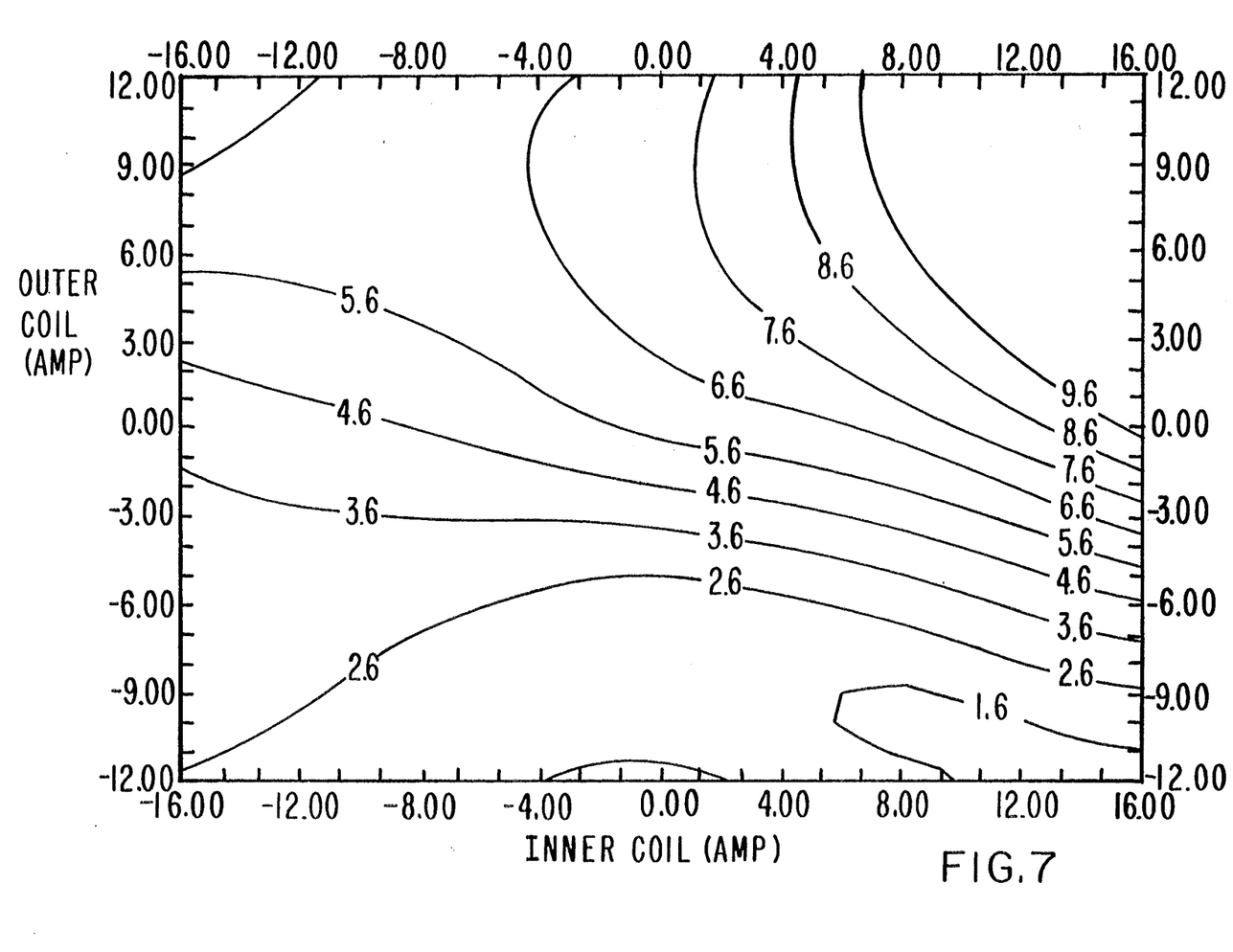
FIG. 7 is a contour map of sheet resistance uniformity for an aluminum thin film as a function of inner and outer coil currents in the particularly preferred embodiment of FIG. 5.

FIG. 7 is a contour map of sheet resistance uniformity for an aluminum thin film as a function of inner and outer coil currents in the particularly preferred embodiment of FIG. 5. The region of best uniformity is found at the lower right in this figure where the current in the outer coil is a negative 12 amps and the current in the inner coil is a positive 12 amps. Again the magnetic fields from the inner and outer coils are opposing each other when the best uniformity is achieved. The benefits of this invention will be available in conjunction with magnetic fields where the inner and outer coils may be aiding one another.

While the present invention has, so far, been described solely in the context of a heart-shaped planar magnetron sputter source, it should be apparent to those skilled in the art that the methodology described herein is equally applicable to other magnet designs intended to produce a predetermined erosion profile in the surface of the sputter target. For example, the teachings of the '958 patent are not limited to heart-shaped magnet arrays, and several non-heart-shaped magnet array configurations are disclosed. To the extent that there is a similar discrepancy between the actual and the effective shape of a magnet array built in accordance with one of the other embodiments, i.e., the static erosion groove does not overlie the magnet centerline, the methodology taught therein can be used to adjust the positions of the individual magnets in the array to achieve a desired effective magnet shape and a desired erosion profile. Likewise, according to the present invention, by appropriate computer modeling, the effect on sputtered film uniformity caused by adjustments in the positions of the individual magnet positions can be directly determined and adjusted by electromagnets.

In the preferred embodiment according to the invention which includes at least one electromagnet behind the rotatable heart-shaped magnet array, the magnet array and conditions are optimized according to the procedure specified above with the current in the electromagnet set to zero. Then incremental amounts of current are added and the system optimization repeated until a new optimum is found with the electromagnet current optimized. In order to compensate for the change of the shape of the target while the target is being depleted the target is then run until partially depleted. The current is then changed incrementally until a second optimum electromagnet current is found. The procedure is repeated a number of times. It is then assumed that the electromagnet current should be varied smoothly from one point to the other with time from the first optimum current with a new target to the second optimum current when the target is almost depleted.

This invention is not limited to the preferred embodiment and alternatives heretofore described, to which variations and improvements could be made, without departing from the scope of protection of the present patent and true spirit of the invention, the characteristics of which are summarized in the following claims.

We claim:

1. A magnetron source for cooperating with a plasma for sputtering atoms from a target and depositing a thin film layer on a substrate comprising:

said target having a first and a second face, said first face being the face from which materials is sputtered, said first face, in operation, being adjacent to said substrate and to said plasma, an electromagnet means for generating a magnetic field of adjustable strength in the space adjacent said second face of said target, said electromagnet means being stationary in space relative to said target, and rotatable magnet array means having an axis of rotation for generating a movable magnetic field, said rotatable magnet array means having a center line, said rotatable magnet array means being positioned adjacent to said second face of said target and between said electromagnet means and said target, wherein said electromagnet means for generating a magnetic field of adjustable strength provides magnetic field lines which loop through said rotatable magnet means and which modify the magnetic field intensity lines which emanate from said rotatable magnet means and loop through said target, said electromagnetic means includes a first flat coil of diameter smaller than that of said target, and wherein said flat coil of said electromagnet means for generating a magnetic field of variable strength has a center and where said center lies on the axis of rotation of said rotatable means for generating a movable magnetic field.

2. The magnetron source of claim 1 wherein, in operation, said rotatable magnet means causes an erosion profile in said target which is offset from said centerline of said magnet array and which produces a groove wherein substantially all of said groove lies on a first curve.

3. The magnetron source of claim 2 wherein said target is planar and said first curve is defined by $$\theta = \int_1^r \frac{\sqrt{\xi^2(u)u^2 - 1}}{u} du + C$$

where $\xi(u)$ is said erosion profile.

4. The magnetron source of claim 1 wherein said rotatable magnet means forms a generally heart-shaped curve.

5. The magnetron source of claim 2 wherein said rotatable magnet means forms a generally heart-shaped curve.

6. The magnetron source of claim 3 wherein said rotatable magnet means forms a generally heart-shaped curve.

7. The magnetron sputtering source of claim 1 wherein said rotatable magnet means comprises an array of individual permanent magnets disposed on a curve.

8. The magnetron sputtering source of claim 4 wherein said heart-shaped curve is asymmetrical.

9. The magnetron sputtering source of claim 6 wherein a portion of said heart-shaped curve which lies farthest away from an axis of rotation of said magnet means forms an arc of a circle.

10. The magnetron sputtering apparatus of claim 1 wherein said electromagnet means includes a second flat coil of diameter smaller than said of said diameter first flat coil.

11. The magnetron sputtering apparatus of claim 10 wherein said second flat coil is co-planar with said first flat coil.

12. The magnetron sputtering apparatus of claim 1 wherein said electromagnet means for generating a magnetic field of adjustable strength includes a first channel path for magnet flux in which the reluctance is low as compared to the reluctance of the remaining regions between said electromagnet means and said rotable magnet array means.

13. The magnetron sputtering apparatus of claim 12 wherein said electromagnet means for generating a magnetic field of adjustable strength which loops through the face of said target wherein said channel is made of a ferrous material.

14. The magnetron sputtering source of claim 1 wherein said sputter target defines a non-planar surface of revolution and said curve is defined by $$\theta = \int_1^R \sqrt{\left[1 + \left(\frac{dz}{dr}\right)^2\right][r^2\xi^2(r) + 1]} \frac{dr}{r} + C$$

where ξ(r) is said erosion profile, z(r) defines said surface of revolution, and C is a selected constant.

15. A magnetron sputtering source for depositing a thin film layer on a substrate comprising:
a target having a first and a second face, said first face being the face from which material is sputtered,
a fixed electromagnet means for generating a magnetic field of variable strength, said variable strength field lines looping through the face of said target, said fixed electromagnet means including two co-planar coils, said outer coil being approximately the diameter of said target, and said inner coil being much smaller in diameter, said coils being connectable to independent current sources so that magnetic fields generated by said coils are variable and can be made to oppose each other,
rotatable magnet means for generating a moving magnet field positioned behind said target face, said rotatable magnet means defining a generally heart-shaped, closed-loop centerline, said magnet means including a tip forming an arc of a circle around an axis of rotation of said magnet means, said rotatable means including an array of individual magnets.

16. The magnetron sputtering source of claim 15 wherein said sputter target defines a non-planar surface of revolution and said curve is defined by $$\theta = \int_1^R \sqrt{\left[1 + \left(\frac{dz}{dr}\right)^2\right][r^2\xi^2(r) + 1]} \, \frac{dr}{r} + C$$

where ξ(r) is said erosion profile, z(r) defines said surface of revolution, and C is a selected constant.

* * * * *